United States Patent
He et al.

(10) Patent No.: US 10,776,232 B2
(45) Date of Patent: Sep. 15, 2020

(54) DEEP BELIEF NETWORK FEATURE EXTRACTION-BASED ANALOGUE CIRCUIT FAULT DIAGNOSIS METHOD

(71) Applicant: WUHAN UNIVERSITY, Hubei (CN)

(72) Inventors: Yigang He, Hubei (CN); Chaolong Zhang, Hubei (CN); Hui Zhang, Hubei (CN); Baiqiang Yin, Hubei (CN); Jinguang Jiang, Hubei (CN); Liulu He, Hubei (CN); Jiajun Duan, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 170 days.

(21) Appl. No.: 16/027,284

(22) Filed: Jul. 4, 2018

(65) Prior Publication Data
US 2019/0243735 A1  Aug. 8, 2019

(30) Foreign Application Priority Data
Feb. 5, 2018  (CN) .......................... 2018 1 0111908

(51) Int. Cl.
*G06F 11/22* (2006.01)
*G01R 31/3163* (2006.01)
*G06N 3/08* (2006.01)

(52) U.S. Cl.
CPC ...... *G06F 11/2263* (2013.01); *G01R 31/3163* (2013.01); *G06N 3/084* (2013.01)

(58) Field of Classification Search
CPC . G06F 11/2263; G01R 27/28; G01R 31/3163; H04B 10/0775; H04B 10/07951
See application file for complete search history.

(56) References Cited

U.S. PATENT DOCUMENTS

| | | | | |
|---|---|---|---|---|
| 6,865,500 | B1 * | 3/2005 | Variyam | G01R 31/01 324/762.03 |
| 8,222,910 | B2 * | 7/2012 | Sangam | G01R 31/3163 324/750.3 |
| 10,310,049 | B2 * | 6/2019 | Okuda | G01R 35/00 |
| 2019/0228266 | A1 * | 7/2019 | Habibian | G06K 9/6262 |
| 2019/0353703 | A1 * | 11/2019 | He | G01R 31/316 |

* cited by examiner

*Primary Examiner* — Nadeem Iqbal
(74) *Attorney, Agent, or Firm* — JCIPRNET

(57) ABSTRACT

A Deep Belief Network (DBN) feature extraction-based analogue circuit fault diagnosis method comprises the following steps: a time-domain response signal of a tested analogue circuit is acquired, where the acquired time-domain response signal is an output voltage signal of the tested analogue circuit; DBN-based feature extraction is performed on the acquired voltage signal, wherein learning rates of restricted Boltzmann machines in a DBN are optimized and acquired by virtue of a quantum-behaved particle swarm optimization (QPSO); a support vector machine (SVM)-based fault diagnosis model is constructed, wherein a penalty factor and a width factor of an SVM are optimized and acquired by virtue of the QPSO; and feature data of test data are input into the SVM-based fault diagnosis model, and a fault diagnosis result is output, where the feature data of the test data is generated by performing the DBN-based feature extraction on the test data.

8 Claims, 6 Drawing Sheets

DEEP BELIEF NETWORK FEATURE EXTRACTION-BASED ANALOGUE CIRCUIT FAULT DIAGNOSIS METHOD

CROSS-REFERENCE TO RELATED APPLICATION

This application claims the priority benefit of China application serial no. 201810111908.8, filed on Feb. 5, 2018. The entirety of the above-mentioned patent application is hereby incorporated by reference herein and made a part of this specification.

BACKGROUND OF THE INVENTION

1. Field of the Invention

The present invention relates to the fields of machine learning and electronic circuit engineering, in particular to a deep belief network (DBN) feature extraction-based analogue circuit fault diagnosis method.

2. Description of Related Art

Analogue circuits are widely applied to equipment of household appliances, industrial production lines, automobiles, aerospace and the like. A fault of an analogue circuit may cause performance reduction, dysfunction, slow response and other electronic faults of equipment. Accurate fault recognition is helpful for timely maintenance of a circuit, so that it is necessary to perform fault diagnosis on an analogue circuit.

For fault diagnosis of the analogue circuits, research methods such as wavelet analysis, wavelet fractal analysis (i.e., fractal analysis after wavelet transform), kurtosis and entropy, back-propagation (BP) neural network and support vector machine (SVM) have been introduced into research work. The primary problem in fault diagnosis of an analogue circuit is about extraction of features with high discriminability and a low overlapping degree between each fault type for subsequent efficient fault diagnosis. Therefore, application of an efficient feature extraction method is required to improve fault diagnosis accuracy of the analogue circuit.

Deep belief network (DBN) is a novel fault feature extraction method. It is generally recognized that a DBN may extract deep and inherent features of a measurement signal. A learning rate of a restricted Boltzmann machine (RBM) in the DBN has relatively great influence on a structural parameter of the DBN, and is usually valued to be 0.01 to 0.5 by adopting an empirical method or trial and error method which is low in efficiency and unlikely to obtain an accurate and effective numerical value.

SUMMARY OF THE INVENTION

For the shortcoming of existing analogue circuit fault diagnosis, the present invention is directed to a DBN feature extraction-based analogue circuit fault diagnosis method, to enhance a feature extraction effect of analogue circuit fault diagnosis, improve fault diagnosis accuracy and effectively detect various types of faults of an analogue circuit.

In order to solve the technical problem, the technical solution adopted by the present invention is implemented as follows.

A DBN feature extraction-based analogue circuit fault diagnosis method comprises the following steps:

(1) a time-domain response signal of a tested analogue circuit is acquired, wherein the acquired time-domain response signal is an output voltage signal of the tested analogue circuit and is training data;

(2) DBN-based feature extraction is performed on the acquired voltage signal, wherein extracted data is feature data of the training data, wherein learning rates of RBMs in a DBN are optimized and acquired by virtue of quantum-behaved particle swami optimization (QPSO);

(3) an SVM-based fault diagnosis model is constructed, wherein a penalty factor and a width factor of an SVM are optimized and acquired by virtue of QPSO; and (4) feature data of test data is input into the SVM-based fault diagnosis model, and a fault diagnosis result is output, namely a fault of the analogue circuit is detected, wherein the feature data of the test data is generated by performing the DBN-based feature extraction on the test data.

According to the foregoing solution, in the step (1), an input end of the tested analogue circuit is excited by adopting a pulse, the voltage signal is sampled at an output end of the tested analogue circuit, and the acquired output voltage signal of the tested analogue circuit is the training data.

According to the foregoing solution, in the step (2), the DBN is formed by stacking the multiple RBMs one by one, each RBM consists of a visible layer v and a hidden layer h, each visible layer v consists of multiple visible layer units, each hidden layer h also consists of multiple hidden layer units, the visible layers are input layers of the RBMs, the hidden layers are output layers of the RBMs, the output layer of each RBM is taken as the input layer of the next RBM, and the learning rate of each RBM exerts the following influence on a parameter of the RBM:

$$\Delta w_{ji} = \mu(\langle v_i h_j \rangle_0 - \langle v_i h_j \rangle_1),$$

$$\Delta b_i = \mu(\langle h_j \rangle_0 - \langle h_j \rangle_1) \text{ and}$$

$$\Delta a_j = \mu(\langle v_i \rangle_0 - \langle v_i \rangle_1),$$

where $\Delta w_{ji}$ represents an update amount of a weight matrix connecting the $i^{th}$ visible layer unit $v_i$ and the $j^{th}$ hidden layer $h_j$, $\Delta b_i$ represents an update amount of an offset of the $i^{th}$ visible layer unit $v_i$, $\Delta a_j$ represents an update amount of an offset of the $j^{th}$ hidden layer unit $h_j$, $\mu$ is the learning rate of the RBM, $\langle v_i h_j \rangle_0$ represents an actual value of $v_i h_j$ (an association degree of $v_i$ and $h_j$), $\langle v_i h_j \rangle_1$ represents an expectation of a probability distribution of a reconstructed value of $v_i h_j$, $\langle h_j \rangle_0$ represents an actual value of the hidden layer unit $h_j$, $\langle h_j \rangle_1$ represents an expectation of a probability distribution of a reconstructed value of the hidden layer unit $h_j$, $\langle v_i \rangle_0$ represents an actual value of the visible layer unit $v_i$, and $\langle v_i \rangle_1$ represents an expectation of a probability distribution of a reconstructed value of the visible layer unit $v_i$; and DBN-based feature extraction is divided into three steps: DBN pre-training, classifier-based network global fine regulation and implementation of feature extraction, wherein the DBN pre-training refers to training a DBN model structure and a parameter thereof in an unsupervised manner by virtue of the input analogue circuit fault diagnosis training data; the classifier-based network global fine regulation refers to training the DBN structure and the parameter thereof in a supervised manner by virtue of a classifier tied to the DBN and tag information of the input analogue circuit fault diagnosis training data; and the implementation of feature extraction refers to performing feature extraction layer by layer on the input analogue circuit fault diagnosis training data by virtue of the multiple stacked RBMs in the DBN after completion of the classifier-based network global fine regulation, and an extracted feature in the last RBM is a feature extracted by the DBN.

According to the foregoing solution, the operation that the learning rates of the RBMs in the DBN are optimized and acquired by virtue of QPSO in the step (2) is implemented by the following steps:

(2.1) parameters of QPSO are initialized, including positions of particles, a range of an iterative optimization, a companding factor and a number of iterations, wherein the learning rates of the multiple RBMs required to be optimized are mapped into multidimensional positions of the particles;

(2.2) the multidimensional positions of the particles are mapped into the learning rates of the RBMs in the DBN, and accuracy of fault diagnosis based on the training data is calculated as adaptability by virtue of the classifier tied to the DBN, thereby calculating adaptability of each particle in a swarm;

(2.3) an individual optimal position of each particle and a global optimal position of the swarm are calculated;

(2.4) an average point of the individual optimal positions of all the particles is calculated;

(2.5) position of each particle in the swarm is updated; and (2.6) the step (2.2) to the step (2.5) are repeated till the end of iteration, and a result is output, that is the learning rate of each RBM in the DBN.

According to the foregoing solution, the operation that the penalty factor and the width factor of the SVM are optimized and acquired by virtue of QPSO in the step (3) is implemented by the following steps:

(3.1) parameters of QPSO are initialized, including the positions of the particles, the range of the iterative optimization, the companding factor and the number of iterations, wherein the penalty factor and the width factor of the SVM required to be optimized are mapped into two-dimensional positions of the particles;

(3.2) the two-dimensional positions of the particles are mapped into the penalty factor and the width factor of the SVM, and accuracy of fault diagnosis of the SVM based on the feature data of the training data is calculated as the adaptability, thereby calculating the adaptability of each particle in the quantum-behaved particle swarm;

(3.3) the individual optimal position of each particle and the global optimal position of the quantum-behaved particle swarm are calculated;

(3.4) the average point of the individual optimal positions of all the particles is calculated;

(3.5) position of each particle in the quantum-behaved particle swarm is updated; and (3.6) the step (3.2) to the step (3.5) are repeated till the end of iteration, and the global optimal position is output as an optimization result, that is the penalty factor and the width factor of the SVM.

According to the foregoing solution, in the step (4), the test data is reacquired time-domain response signal data of the tested analogue circuit, and the output fault diagnosis result is a fault diagnosis accuracy.

According to the foregoing solution, the iterative optimization is performed by virtue of QPSO according to the following formulae:

$$nbest = \frac{1}{N}\sum_{i=1}^{N} P_i, \quad P = sP_i + (1-s)P_g$$

and $$X_i(t+1) = P \pm a|nbest - X_i(t)|ln\left(\frac{1}{u}\right),$$

where N is a scale of the swarm, u and s are random numbers uniformly distributed within [0,1], nbest is the average point of the individual optimal positions of all the particles, $P_i$ is the individual optimal position of the particle i, and $P_g$ is the global optimal position of the swarm, where $X_i(t+1)$ is the position, obtained in a $(t+1)^{th}$ iteration, of the particle i, t is a present iteration number and a is the companding factor.

A working principle of the present invention is that the DBN is used at first to analyze a fault response signal of the tested analogue circuit and extract deep and inherent features, wherein the learning rates of the RBMs in the DBN are optimized and generated by virtue of QPSO, and fault recognition is performed on the extracted feature data by virtue of an SVM classifier method, wherein the penalty factor and the width factor of the SVM are optimized and acquired by virtue of QPSO.

Compared with the existing technology, the present invention has the following beneficial effects.

(1) The DBN-based feature extraction method in the present invention has better feature extraction performance than a conventional analogue circuit fault feature extraction method such as wavelet analysis, wavelet fractal analysis and extraction kurtosis and entropy, and nature and deep features of a measured signal may be extracted.

(2) According to the DBN-based feature extraction method in the present invention, a feature extraction effect may be further enhanced after the learning rates of the RBMs are optimized by virtue of QPSO, features of various fault types may be discriminated more obviously, and subsequent fault diagnosis of the classifier is facilitated.

DESCRIPTION OF THE EMBODIMENTS

The present invention will now be further described below in combination with the accompanying drawings and embodiments.

Figure 1:
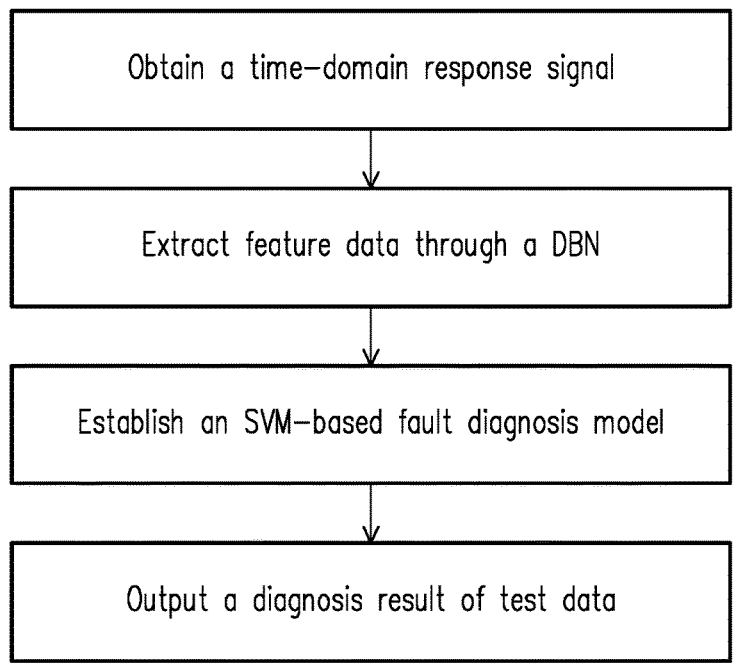
FIG. 1 is a flowchart of an analogue circuit fault diagnosis method according to the present invention.

Referring to FIG. 1, a flowchart of an analogue circuit fault diagnosis method of the present invention comprises 4 steps. In step 1, a time-domain response signal of a tested analogue circuit is acquired. In step 2, feature data is extracted from the acquired time-domain response signal by virtue of a DBN. In step 3, an SVM-based fault diagnosis model is established. In step 4, a test data diagnosis result is output. The present invention will be described below in detail.

In step 1, the time-domain response signal of the tested analogue circuit is acquired, an input end of the tested analogue circuit is excited by adopting a pulse, a voltage signal is sampled at an output end of the tested analogue circuit, and the acquired output voltage signal of the tested analogue circuit is training data.

In step 2, the DBN is formed by stacking multiple RBMs one by one, each RBM consists of a visible layer v and a hidden layer h, each visible layer v consists of multiple visible layer units, and each hidden layer h also consists of multiple hidden layer units, wherein the visible layers are input layers of the RBMs, the hidden layers are output layers of the RBMs, and the output layer of each RBM is taken as the input layer of the next RBM. A learning rate of each RBM exerts the following influence on a parameter of the RBM:

$$\Delta w_{ji} = \mu(<v_i h_j>_0 - <v_i h_j>_1),$$

$$\Delta b_i = \mu(<h_j>_0 - <h_j>_1) \text{ and}$$

$$\Delta a_j = \mu(<v_i>_0 - <v_i>_1)$$

where $\Delta w_{ji}$ represents an update amount of a weight matrix connecting the $i^{th}$ visible layer unit $v_i$ and the $j^{th}$ hidden layer $h_j$, $\Delta b_i$ represents an update amount of an offset of the $i^{th}$ visible layer unit $v_i$, $\Delta a_j$ represents an update amount of an offset of the $j^{th}$ hidden layer unit $h_j$, $\mu$ is the learning rate of the RBM, $<v_i h_j>_0$ represents an actual value of $v_i h_j$, $<v_i h_j>_1$ represents an expectation of a probability distribution of a reconstructed value of $v_i h_j$, $<h_j>_0$ represents an actual value of the hidden layer unit $h_j$, $<h_j>_1$ represents an expectation of a probability distribution of a reconstructed value of the hidden layer unit $h_j$, $<v_i>_0$ represents an actual value of the visible layer unit $v_i$, and $<v_i>_1$ represents an expectation of a probability distribution of a reconstructed value of the visible layer unit $v_i$; and DBN-based feature extraction is divided into three steps: DBN pre-training, classifier-based network global fine regulation and implementation of feature extraction, wherein the DBN pre-training refers to training a DBN model structure and a parameter thereof in an unsupervised manner by virtue of the input analogue circuit fault diagnosis training data; the classifier-based network global fine regulation refers to training the DBN structure and the parameter thereof in a supervised manner by virtue of a classifier tied to the DBN and tag information of the input analogue circuit fault diagnosis training data; and the implementation of feature extraction refers to performing feature extraction layer by layer on the input analogue circuit fault diagnosis training data by virtue of the multiple stacked RBMs in the DBN after completion of the classifier-based network global fine regulation, and an extracted feature in the last RBM is a feature extracted by the DBN.

The operation that the learning rates of the RBMs in the DBN are optimized and acquired by virtue of QPSO is implemented by the following steps:

(2.1) parameters of QPSO are initialized, including positions of particles, a range of an iterative optimization, a companding factor and a number of iterations, and the learning rates of the multiple RBMs required to be optimized are mapped into multidimensional positions of the particles;

(2.2) the multidimensional positions of the particles are mapped into the learning rate of each RBM in the DBN, and accuracy of fault diagnosis based on the training data is calculated as adaptability by virtue of the classifier tied to the DBN, thereby calculating adaptability of each particle in a swarm;

(2.3) an individual optimal position of each particle and a global optimal position of the swarm are calculated;

(2.4) an average point of the individual optimal positions of all the particles is calculated;

(2.5) position of each particle in the swarm is updated; and (2.6) the step (2.2) to the step (2.5) are repeated till the end of iteration, and a result is output, i.e., the learning rate of each RBM in the DBN.

Iterative optimization is performed by virtue of QPSO according to the following formulae:

$$nbest = \frac{1}{N}\sum_{i=1}^{N} P_i, \quad P = sP_i + (1-s)P_g$$

and $$X_i(t+1) = P \pm a|nbest - X_i(t)|ln\left(\frac{1}{u}\right),$$

where N is a scale of the swarm, u and s are random numbers uniformly distributed within [0,1], nbest is the average point of the individual optimal positions of all the particles, $P_i$ is the individual optimal position of the particle i, and $P_g$ is the global optimal position of the swarm, where $X_i(t+1)$ is the position, obtained in the $(t+1)^{th}$ iteration, of the particle i, t is a present iteration number and a is the companding factor.

In step 3, the operation that a penalty factor and a width factor of an SVM are optimized and acquired by virtue of QPSO is implemented by the following steps:

(3.1) parameters of QPSO are initialized, including the positions of the particles, the range of the iterative optimization, the companding factor and the number of iterations, and the penalty factor and the width factor of the SVM required to be optimized are mapped into two-dimensional positions of the particles;

(3.2) the two-dimensional positions of the particles are mapped into the penalty factor and the width factor of the SVM, and accuracy of fault diagnosis of the SVM based on the feature data of the training data is calculated as the adaptability, thereby calculating the adaptability of each particle in the quantum particle swarm;

(3.3) the individual optimal position of each particle and the global optimal position of the swarm are calculated;

(3.4) the average point of the individual optimal positions of all the particles is calculated;

(3.5) position of each particle in the swarm is updated; and (3.6) the step (3.2) to the step (3.5) are repeated till the end of iteration, and the global optimal position is output as an optimization result, i.e., the penalty factor and the width factor of the SVM.

The SVM-based fault diagnosis model is established by the following steps:

(1) a sample d={$(x_u, y_u)$, u=1, 2, ... n}, $x_u \in R^n$, $y_u \in \{-1,1\}$ is input, wherein n is the amount of sample data, $x_u$ is input data for model establishment, and $y_u$ is a tag corresponding to the input data;

(2) a type of a kernel function is determined:

a radial basis function $$k(x, x_u) = \exp\left(-\frac{\|x - x_u\|^2}{2\sigma^2}\right)$$

is taken as the kernel function, wherein x is present input data and σ is a width factor of the radial basis function;

(3) parameters σ and γ of the model are selected by virtue of QPSO, wherein γ is a penalty factor;

(4) the model is trained by taking the sample data as training data to obtain model parameters $a_u$ and b, wherein $a_u$ is a Lagrange operator and b is an offset value; and (5) the fault diagnosis model is acquired:

$$f(x) = \text{sgn}\left(\sum_{u=1}^{n} a_u y_u k(x, x_u) + b\right),$$

where $f(x)$ is used for recognizing a type of newly input data.

In step 4, test data is reacquired time-domain response signal data of the tested analogue circuit, the output fault diagnosis result is fault diagnosis accuracy, and its calculation formula is:

fault diagnosis accuracy=the amount of accurately recognized test data/the total amount of the test data.

For illustrating a process and performance of a DBN feature extraction-based analogue circuit fault diagnosis method disclosed in the present invention, descriptions will be made herein with an embodiment.

Figure 2:
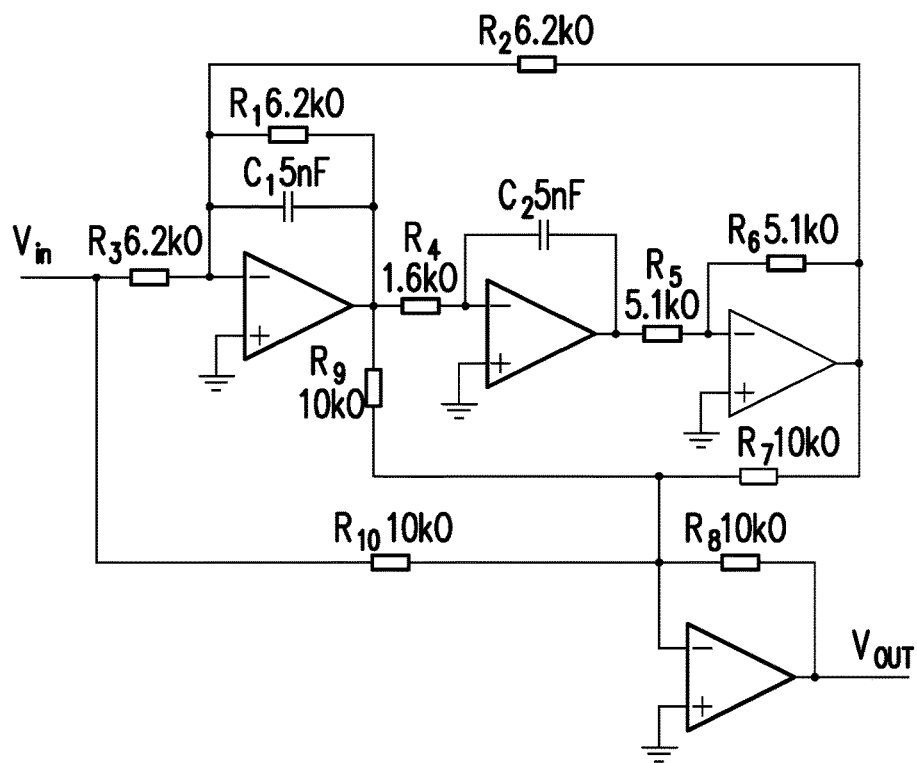
FIG. 2 is a circuit diagram of a four-operational amplifier biquad high-pass filters.

FIG. 2 shows a four-operational amplifier biquad high-pass filter, and a nominal value of each component is marked in the figure. An excitation source adopts an pulse wave with a duration of 10 us and an amplitude of 10 v, and a time-domain fault response signal is obtained by sampling at an output end of the circuit. By a sensitivity test, $R_1$, $R_2$, $R_3$, $R_4$, $C_1$ and $C_2$ are selected as test objects, and totally 11 fault types, i.e., NF, $R_1\uparrow$, $R_1\downarrow$, $R_2\uparrow$, $R_2\downarrow$, $R_3\uparrow$, $R_3\downarrow$, $R_4\uparrow$, $R_4\downarrow$, $C_1\uparrow$, $C_1\downarrow$, $C_2\uparrow$ and $C_2\downarrow$, are formed, wherein $\uparrow$ and $\downarrow$ represent 25% higher than and lower than the nominal values of the components respectively, and NF represents no fault. A Monte Carlo method is applied to acquire 120 data samples for each fault type, and the output time-domain response signal sampled is 100-dimensional. Table 1 shows a fault code, a fault type, a nominal value and a fault value of each test component in the circuit.

The measured 100-dimensional time pulse response data is directly input into an input layer of a DBN. A double-RBM structure is adopted for the DBN, and the numbers of hidden layer units in the first and second RBMs are set to be 50 and 25 respectively. There are totally 120 samples for each fault type, wherein 60 samples are randomly selected as training data for optimizing and acquiring learning rates of the RBMs in the DBN-based feature extraction method, and feature data is generated to train an SVM-based fault diagnosis model. The other 60 samples are taken as test data for testing the performance of the fault diagnosis method. In the present invention, the learning rates of the first RBM and the second RBM are obtained by QPSO. A particle scale and a maximum generation of QPSO are set to be 10 and 100 respectively, a position of each particle is limited between 0.005 and 1, and a companding factor is linearly decreased from 1 to 0.3 along with evolution. A termination condition of the optimization process is that diagnosis accuracy reaches 100% or reaches the maximum generation.

Figure 3:
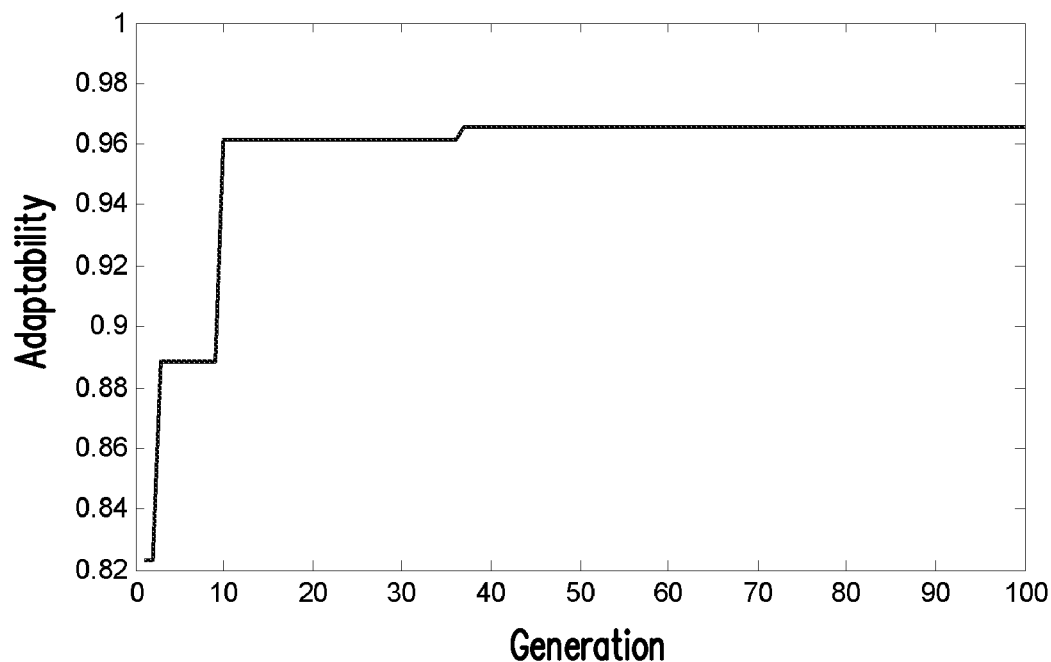
FIG. 3 is a diagram of a QPSO-based optimization process for learning rates of RBMs in a DBN.

The learning rates, optimized and acquired by QPSO, of the first RBM and the second RBM are 0.044994542976916 and 0.035064909557063 respectively. FIG. 3 shows a QPSO-based optimization process of the learning rates of the RBMs. From the figure, it can be seen that, in the QPSO-based optimization process, the adaptability is obviously improved in the 3rd, 10th and 37th generations, and this shows that a global optimal position is updated in the optimization process, that is, better learning rates of the RBMs are discovered by a particle swarm of QPSO in the 3rd, 10th and 37th generations.

TABLE 1

Fault Code, Fault Type, Nominal Value and Fault Value of Each Test Component

| Fault code | Fault type | Nominal value | Fault value |
|---|---|---|---|
| F0 | NF | — | — |
| F1 | $R_1\uparrow$ | 6.2 kΩ | 7.75 kΩ |
| F2 | $R_1\downarrow$ | 6.2 kΩ | 4.65 kΩ |
| F3 | $R_2\uparrow$ | 6.2 kΩ | 7.75 kΩ |
| F4 | $R_2\downarrow$ | 6.2 kΩ | 4.65 kΩ |
| F5 | $R_3\uparrow$ | 6.2 kΩ | 7.75 kΩ |
| F6 | $R_3\downarrow$ | 6.2 kΩ | 4.65 kΩ |
| F7 | $R_4\uparrow$ | 1.6 kΩ | 2 kΩ |
| F8 | $R_4\downarrow$ | 1.6 kΩ | 1.2 kΩ |
| F9 | $C_1\uparrow$ | 5 nF | 6.25 nF |
| F10 | $C_1\downarrow$ | 5 nF | 3.75 nF |
| F11 | $C_2\uparrow$ | 5 nF | 6.25 nF |
| F12 | $C_2\downarrow$ | 5 nF | 3.75 nF |

Figure 4:
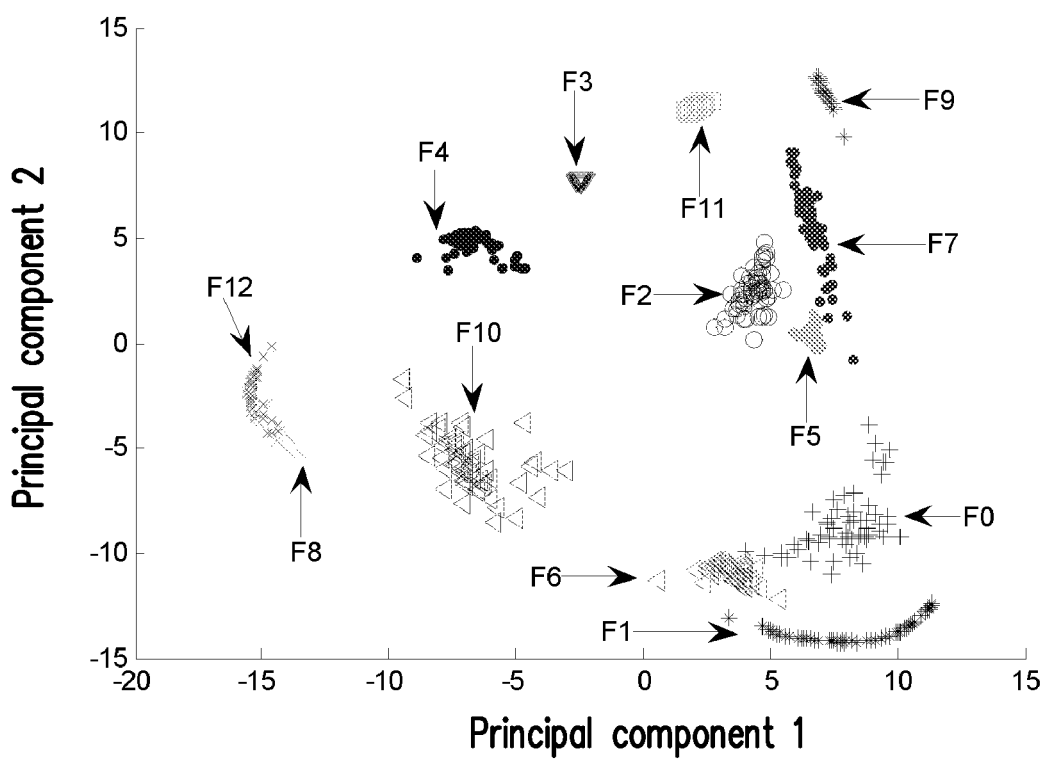
FIG. 4 is a scatter distribution diagram of various fault types after features extracted by virtue of optimized and acquired learning rates of RBMs are processed by a Kernel Principal Component Analysis (KPCA) method.

The optimized and acquired learning rates are adopted to extract features in the embodiment by virtue of the disclosed DBN method. For visualizing a scatter distribution condition of various fault types corresponding to the extracted features, two principle components in the extracted features are acquired by virtue a KPCA method herein, and are shown in FIG. 4. From FIG. 4, it can be seen that only fault types F8 and F12 are overlapped.

Figure 5:
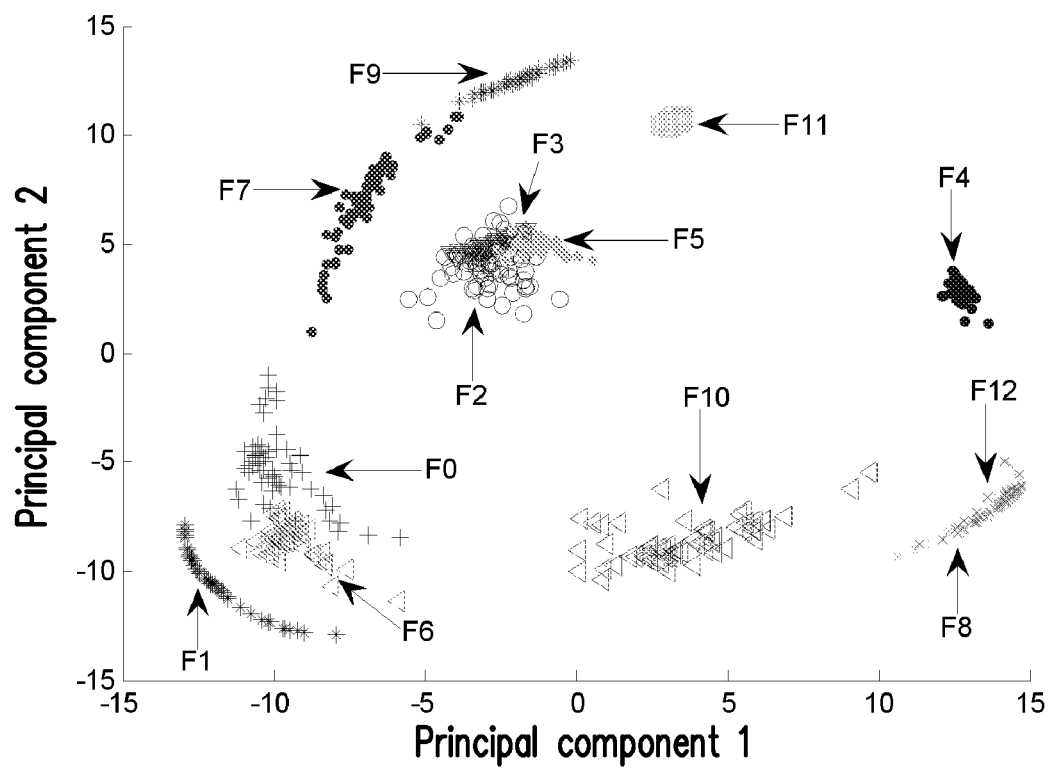
FIG. 5 is a two-dimensional scatter distribution diagram of various fault types after features extracted by taking 0.01 as learning rates of RBMs are processed by a KPCA method.
Figure 6:
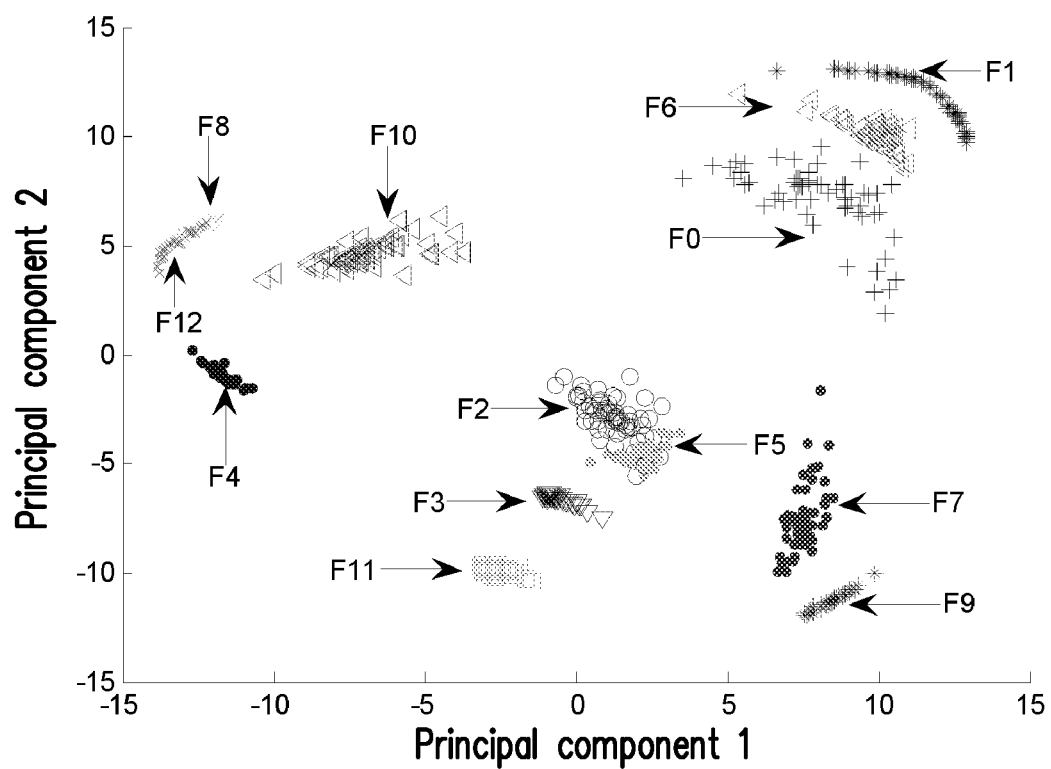
FIG. 6 is a two-dimensional scatter distribution diagram of various fault types after features extracted by taking 0.02 as learning rates of RBMs are processed by a KPCA method.
Figure 7:
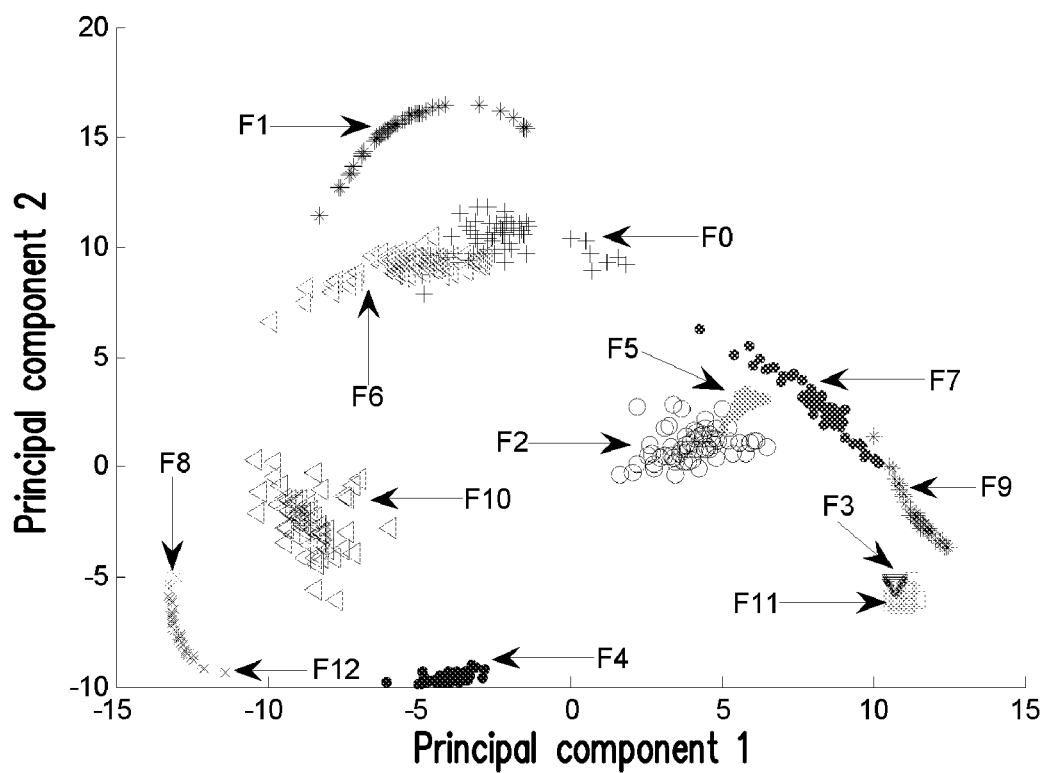
FIG. 7 is a two-dimensional scatter distribution diagram of various fault types after features extracted by taking 0.05 as learning rates of RBMs are processed by a KPCA method.
Figure 8:
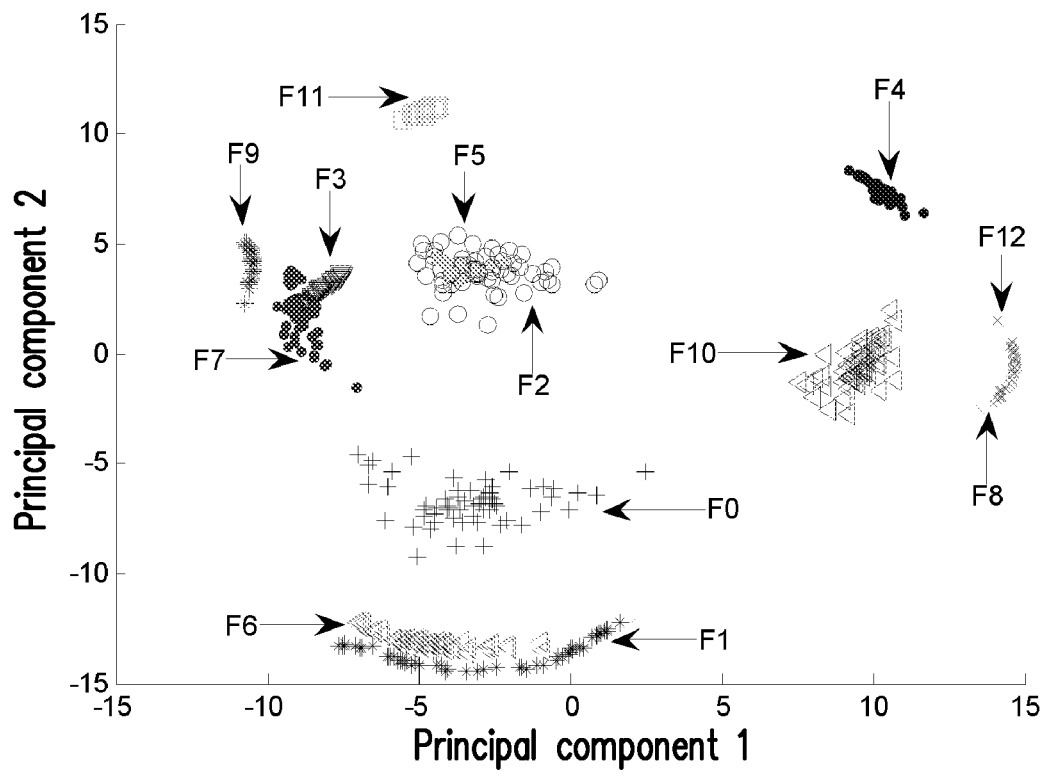
FIG. 8 is a two-dimensional scatter distribution diagram of various fault types after features extracted by taking 0.1 as learning rates of RBMs are processed by a KPCA method.
Figure 9:
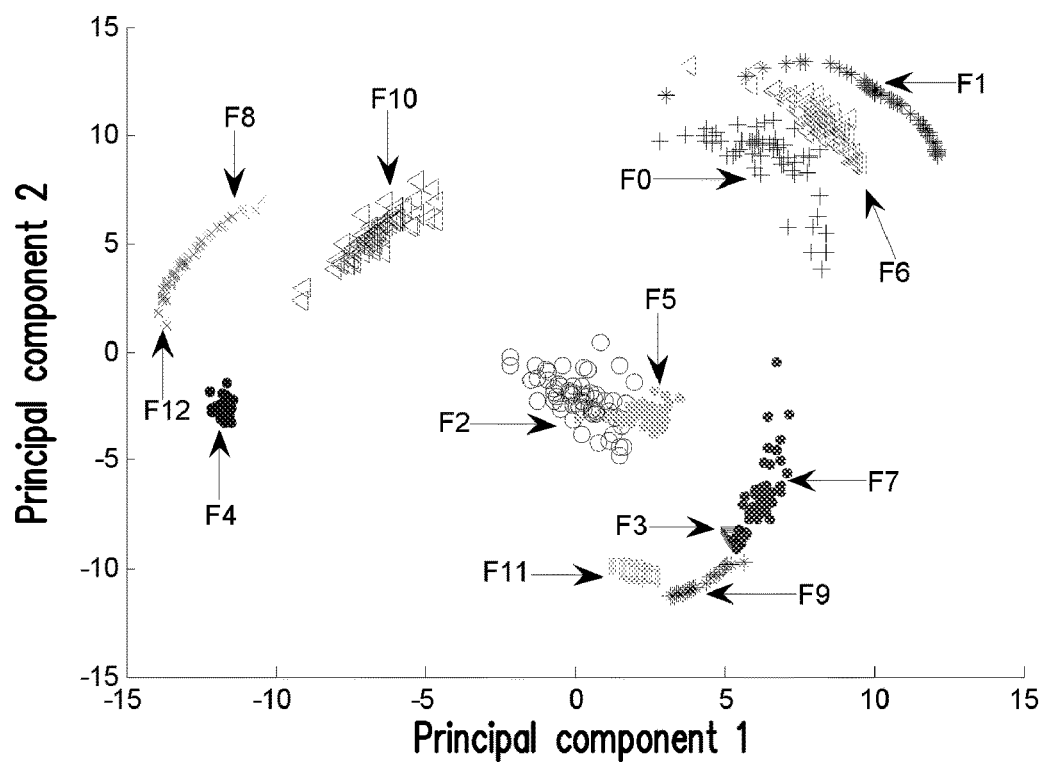
FIG. 9 is a two-dimensional scatter distribution diagram of various fault types after features extracted by taking 0.2 as learning rates of RBMs are processed by a KPCA method.
Figure 10:
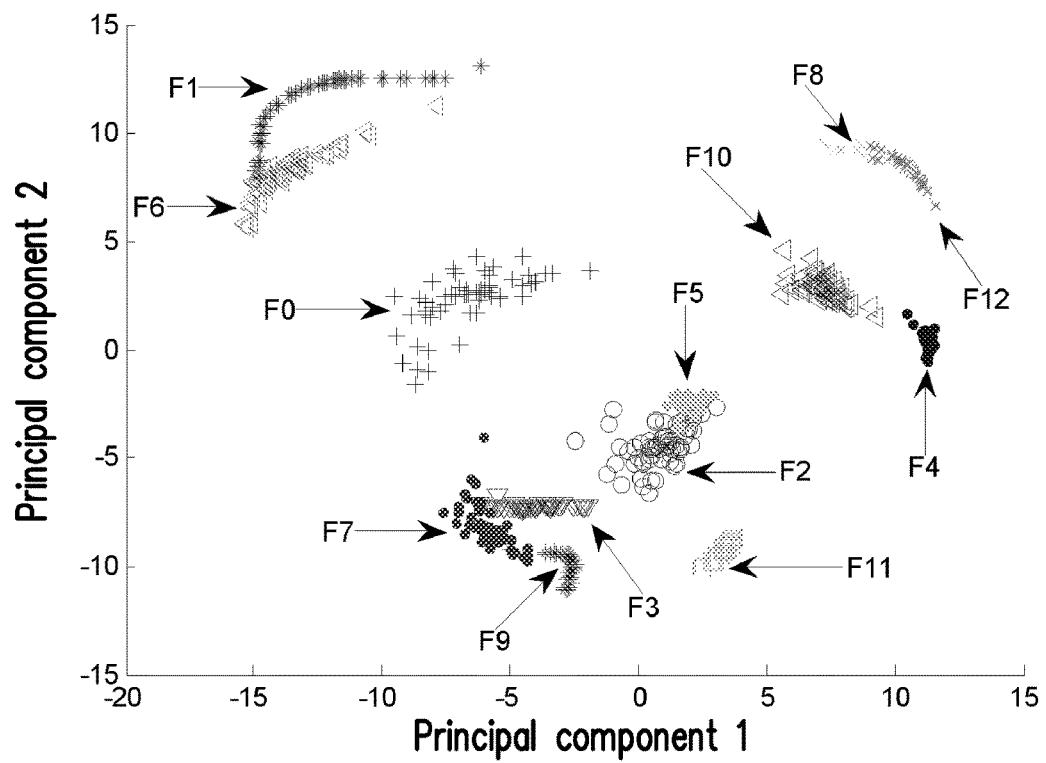
FIG. 10 is a two-dimensional scatter distribution diagram of various fault types after features extracted by taking 0.5 as learning rates of RBMs are processed by a KPCA method.

Experience shows that a value interval of a learning rate of an RBM in a DBN is usually [0.01, 0.5], and an empirical method or a trial and error method are generally adopted for acquisition in previous research. Therefore, the fault features are extracted and compared on the basis of the training data by taking 0.01, 0.02, 0.05, 0.1, 0.2 and 0.5 as the learning rates of the RBMs respectively. The training data of the embodiment is taken as input, and the extracted features in the DBN are taken as output and are displayed in FIG. 5-FIG. 10 after two principal components are extracted by KPCA. Wherein, FIG. 5 shows a two-dimensional scatter distribution after features extracted by taking 0.01 as the learning rates of the RBMs are processed by the KPCA method, slight overlapping exists between fault types F0 and F6, obvious overlapping exists among fault types F2, F3 and F5, and serious overlapping exists between fault types F8 and F12. FIG. 6 shows a two-dimensional scatter distribution after features extracted by taking 0.02 as the learning rates of the RBMs are processed by the KPCA method, an overlapping phenomenon exists between fault types F2 and F5, and serious overlapping exists between fault types F8 and F12. FIG. 7 shows a two-dimensional scatter distribution after features extracted by taking 0.05 as the learning rates of the RBMs are processed by the KPCA method, the overlapping phenomenon exists between fault types F0 and F6, between fault types F2 and F5 and between fault types F3 and F11, and serious overlapping exists between fault types F8 and F12. FIG. 8 shows a two-dimensional scatter distribution after features extracted by taking 0.1 as the learning rates of the RBMs are processed by the KPCA method, the overlapping phenomenon exists between fault types F1 and F6 and between F3 and F7, and serious overlapping exists between fault types F2 and F5 and between F8 and F12. FIG. 9 shows a two-dimensional scatter distribution after features extracted by taking 0.2 as the learning rates of the RBMs are processed by the KPCA method, the overlapping phenomenon exists between fault types F1 and F6, between fault types F2 and F5 and between fault types F3 and F7, and serious overlapping exists between fault types F8 and F12. FIG. 10 shows a two-dimensional scatter distribution after features extracted by taking 0.5 as the learning rates of the RBMs are processed by the KPCA method, the overlapping phenomenon exists between fault types F1 and F6, between fault types F2 and F5 and between fault types F3 and F7, and serious overlapping exists between fault types F8 and F12.

On the basis of foregoing visual comparison results of the feature scatter distributions in FIG. 4-FIG. 10, it can be believed that, compared with features extracted by a conventional DBN method in which the learning rates of the RBMs are set according to the empirical method or the trial and error method, the features extracted after the learning rates of the RBMs in the DBN are optimized and acquired by QPSO in the present invention have higher separability between different fault types and are combined more closely in the same fault type. The DBN method disclosed in the present invention may be used for learning deep and inherent features of fault input data of the analogue circuit and expressing nonlinear mapping between the input data and the features more effectively so as to make it easier to discriminate various formed fault types, and is beneficial for increasing an accurate recognition rate of a subsequent fault diagnosis method.

Figure 11:
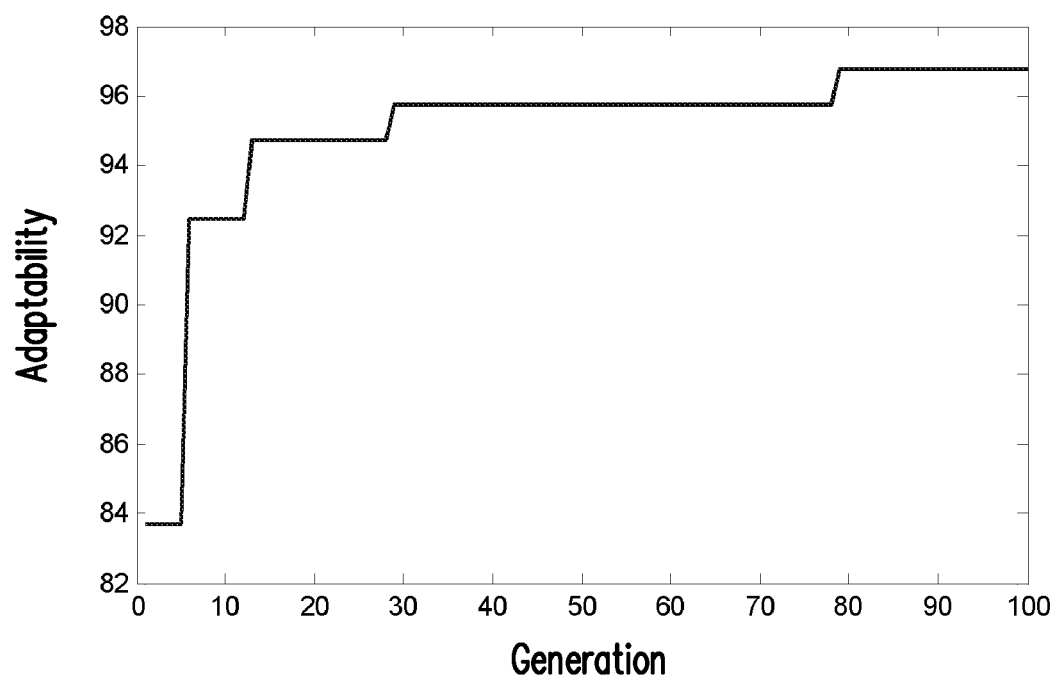
FIG. 11 is a diagram of a QPSO-based optimization process for a penalty factor and a width factor of an SVM.

On the basis of feature data of the training data extracted by the DBN method disclosed in the present invention, a fault diagnosis model of the analogue circuit is established by virtue of an SVM algorithm, thereby identifying various types of faults of the analogue circuit. For improving diagnosis accuracy of the fault diagnosis model, a penalty factor and a width factor of the SVM algorithm are optimized and acquired for establishment of the fault diagnosis model on the basis of the feature data of the training data by virtue of QPSO in the present invention. During optimization, the particle scale and the maximum generation of QPSO are set to be 10 and 100 respectively, a position of each particle is limited between $10^{-3}$ and $10^3$, the companding factor is linearly decreased from 1 to 0.3 along with evolution, and the termination condition of the optimization process is that the diagnosis accuracy reaches 100% or reaches the maximum generation. The QPSO-based optimization process for the penalty factor and the width factor is shown in FIG. 11. From the figure, it can be seen that, in the QPSO-based optimization process, the adaptability is obviously improved in the 6th, 13th, 29th and 79th generations, and this shows that the global optimal position is updated in the optimization process, that is, a better penalty factor and a better width factor of the SVM during analogue circuit fault diagnosis are discovered by virtue of the particles of QPSO in these generations. The finally optimized and acquired penalty factor and width factor are 100.1249 and 0.0109 respectively.

The optimized and acquired penalty factor and width factor are adopted to establish an SVM-algorithm-based fault diagnosis model to test the test data in the embodiment. Diagnosis results of each fault type are shown in Table 2. From the table, it can be seen that fault types F0, F1, F2, F3, F4, F5, F6, F7, F9, F10 and F11 are accurately identified by the SVM-algorithm-based diagnosis model. In 60 fault type F8, 49 are accurately recognized, and 11 are diagnosed as fault type F12. In 60 fault type F12, 43 are accurately recognized, and 17 are diagnosed as fault type F8. A feature scatter distribution range overlapping phenomenon exists between the confused fault types F8 and F12 in a feature extraction process. The overall fault diagnosis accuracy of the embodiment is 96.41%.

TABLE 2

Diagnosis Result of Each Fault Type

| Fault code | Fault type | Accuracy |
|---|---|---|
| F0 | NF | 100% |
| F1 | $R_1\uparrow$ | 100% |
| F2 | $R_1\downarrow$ | 100% |
| F3 | $R_2\uparrow$ | 100% |
| F4 | $R_2\downarrow$ | 100% |
| F5 | $R_3\uparrow$ | 100% |
| F6 | $R_3\downarrow$ | 100% |
| F7 | $R_4\uparrow$ | 100% |
| F8 | $R_4\downarrow$ | 81.7% |
| F9 | $C_1\uparrow$ | 100% |
| F10 | $C_1\downarrow$ | 100% |
| F11 | $C_2\uparrow$ | 100% |
| F12 | $C_2\downarrow$ | 71.7% |

For verifying the performance of the DBN feature extraction method-based fault diagnosis method disclosed in the present invention, fault diagnosis tests are made in comparison with the wavelet analysis, wavelet fractal analysis and kurtosis and entropy feature extraction methods respectively. A classifier adopts the SVM method of optimizing and acquiring the penalty factor and the width factor on the basis of QPSO. Table 3 shows accurate fault diagnosis rates corresponding to wavelet analysis, wavelet fractal analysis and kurtosis and entropy feature extraction and the DBN-based feature extraction method disclosed in the present invention. The overall accurate fault diagnosis rate of the method disclosed in the present invention may reach 96.41%, and is the highest accurate fault diagnosis rate in the four methods. Since these methods all adopt the SVM method in which the penalty factor and the width factor are optimized on the basis of QPSO as the classifier, it can be believed that the DBN-based feature extraction method disclosed in the present invention is better than the wavelet analysis, wavelet fractal analysis and kurtosis and entropy feature extraction methods.

TABLE 3

Comparison about Accurate Fault Diagnosis Rate

| Feature extraction method | Accurate fault diagnosis rate |
|---|---|
| Wavelet analysis | 95.90% |
| Wavelet fractal analysis | 95.38% |
| Kurtosis and entropy | 96.15% |
| Method of the present invention | 96.41% |

The above exemplarily describes the present invention in combination with the accompanying drawings, and various variations and transformations may be made to the structure and the layout. Therefore, equivalent technical solutions shall fall within the scope of the present invention. All non-substantive improvements adopting the concept and solutions of the present invention fall within the scope of protection of the present invention.

What is claimed is:

1. A deep belief network (DBN) feature extraction-based analogue circuit fault diagnosis method, comprising the following steps:
   (1) acquiring a time-domain response signal of a tested analogue circuit, wherein the acquired time-domain response signal is an output voltage signal of the tested analogue circuit and is training data;
   (2) performing the DBN-based feature extraction on the acquired voltage signal, wherein extracted data is feature data of the training data, wherein multiple learning rates of multiple restricted Boltzmann machines (RBMs) in a DBN are optimized and acquired by virtue of a quantum-behaved particle swarm optimization (QPSO);
   (3) constructing a support vector machine (SVM)-based fault diagnosis model, wherein a penalty factor and a width factor of an SVM are optimized and acquired by virtue of the QPSO; and
   (4) inputting feature data of a test data into the SVM-based fault diagnosis model, and outputting a fault diagnosis result, so as to detect a fault of the analogue circuit, wherein the feature data of the test data is generated by performing the DBN-based feature extraction on the test data.

2. The DBN feature extraction-based analogue circuit fault diagnosis method according to claim 1, wherein in the step (1), an input end of the tested analogue circuit is excited by adopting a pulse, the voltage signal is sampled at an output end of the tested analogue circuit, and the acquired output voltage signal of the tested analogue circuit is the training data.

3. The DBN feature extraction-based analogue circuit fault diagnosis method according to claim 1, wherein in the step (2), the DBN is formed by stacking the multiple RBMs one by one, each RBM consists of a visible layer v and a hidden layer h, each visible layer v consists of multiple visible layer units, each hidden layer h also consists of multiple hidden layer units, the visible layers are input layers of the RBMs, the hidden layers are output layers of the RBMs, the output layer of each RBM is taken as the input layer of the next RBM, and the learning rate of each RBM exerts the following influence on a parameter of the RBM:

$$\Delta w_{ji} = \mu(<v_i h_j>_0 - <v_i h_j>_1)$$

$$\Delta b_i = \mu(<h_j>_0 - <h_j>_1) \text{ and}$$

$$\Delta a_j = \mu(<v_i>_0 - <v_i>_1),$$

where $\Delta w_{ji}$ represents an update amount of a weight matrix connecting the $i^{th}$ visible layer unit $v_i$ and the $j^{th}$ hidden layer $h_j$, $\Delta b_i$ represents an update amount of an offset of the $i^{th}$ visible layer unit $v_i$, $\Delta a_j$ represents an update amount of an offset of the $j^{th}$ hidden layer unit $h_j$, $\mu$ is the learning rate of the RBM, $<v_i h_j>_0$ represents an actual value of $v_i h_j$, $<v_i h_j>_1$ represents an expectation of a probability distribution of a reconstructed value of $v_i h_j$, $<h_j>_0$ represents an actual value of the hidden layer unit $h_j$, $<h_j>_1$ represents an expectation of a probability distribution of a reconstructed value of the hidden layer unit $h_j$, $<v_i>_0$ represents an actual value of the visible layer unit $v_i$, and $<v_i>_1$ represents an expectation of a probability distribution of a reconstructed value of the visible layer unit $v_i$; and the DBN-based feature extraction is divided into three steps: a DBN pre-training, a classifier-based network global fine regulation and an implementation of feature extraction, wherein the DBN pre-training refers to training a DBN model structure and a parameter thereof in an unsupervised manner by virtue of an input analogue circuit fault diagnosis training data; the classifier-based network global fine regulation refers to training the DBN structure and the parameter thereof in a supervised manner by virtue of a classifier tied to the DBN and tag information of the input analogue circuit fault diagnosis training data; and the implementation of feature extraction refers to performing feature extraction layer by layer on the input analogue circuit fault diagnosis training data by virtue of the multiple stacked RBMs in the DBN after completion of the classifier-based network global fine regulation, and an extracted feature in the last RBM is a feature extracted by the DBN.

4. The DBN feature extraction-based analogue circuit fault diagnosis method according to claim 3, wherein optimizing and acquiring the learning rates of the RBMs in the DBN by virtue of the QPSO in the step (2) is implemented by the following steps:
   (2.1) initializing multiple parameters of the QPSO, including multiple positions of multiple particles, a range of an iterative optimization, a companding factor and a number of iterations, wherein the learning rates of the multiple RBMs required to be optimized are mapped into multiple multidimensional positions of the particles;
   (2.2) mapping the multidimensional positions of the particles into the learning rates of the RBMs in the DBN, and calculating an accuracy of fault diagnosis based on the training data as an adaptability by virtue of the classifier tied to the DBN, thereby calculating the adaptability of each particle in a swarm;
   (2.3) calculating an individual optimal position of each particle and a global optimal position of the swarm;
   (2.4) calculating an average point of the individual optimal positions of all the particles;
   (2.5) updating the position of each particle in the swami; and
   (2.6) repeating the step (2.2) to step (2.5) till an end of the iterations, and outputting a result that is the learning rate of each RBM in the DBN.

5. The DBN feature extraction-based analogue circuit fault diagnosis method according to claim 1, wherein optimizing and acquiring the penalty factor and the width factor of the SVM by virtue of the QPSO in the step (3) is implemented by the following steps:

(3.1) initializing multiple parameters of the QPSO, including the multiple positions of multiple particles, a range of an iterative optimization, a companding factor and a number of iterations, wherein the penalty factor and the width factor of the SVM required to be optimized are mapped into multiple two-dimensional positions of the particles;

(3.2) mapping the two-dimensional positions of the particles into the penalty factor and the width factor of the SVM, and calculating an accuracy of fault diagnosis of the SVM based on the feature data of the training data as an adaptability, thereby calculating the adaptability of each particle in a quantum-behaved particle swarm;

(3.3) calculating an individual optimal position of each particle and a global optimal position of the quantum-behaved particle swarm;

(3.4) calculating an average point of the individual optimal positions of all the particles;

(3.5) updating the position of each particle in the quantum-behaved particle swarm; and (3.6) repeating the step (3.2) to step (3.5) till an end of the iterations, and outputting the global optimal position as an optimization result that is the penalty factor and the width factor of the SVM.

6. The DBN feature extraction-based analogue circuit fault diagnosis method according to claim 1, wherein in the step (4), the test data is reacquired time-domain response signal data of the tested analogue circuit, and the output fault diagnosis result is a fault diagnosis accuracy.

7. The DBN feature extraction-based analogue circuit fault diagnosis method according to claim 4, wherein the iterative optimization is performed by virtue of the QPSO according to the following formulae:

$$nbest = \frac{1}{N}\sum_{i=1}^{N} P_i, \ P = sP_i + (1-s)P_g$$

and $$X_i(t+1) = P \pm a|nbest - X_i(t)|ln\left(\frac{1}{u}\right),$$

wherein N is a scale of the swarm, u and s are random numbers uniformly distributed within [0,1], nbest is the average point of the individual optimal positions of all the particles, $P_i$ is the individual optimal position of the particle i, and $P_g$ is the global optimal position of the swarm, wherein $X_i(t+1)$ is the position, obtained in a $(t+1)^{th}$ iteration, of the particle i, t is a present iteration number and a is the companding factor.

8. The DBN feature extraction-based analogue circuit fault diagnosis method according to claim 5, wherein the iterative optimization is performed by virtue of the QPSO according to the following formulae:

$$nbest = \frac{1}{N}\sum_{i=1}^{N} P_i, \ P = sP_i + (1-s)P_g$$

and $$X_i(t+1) = P \pm a|nbest - X_i(t)|ln\left(\frac{1}{u}\right),$$

wherein N is a scale of the quantum-behaved particle swarm, a and s are random numbers uniformly distributed within [0,1], nbest is the average point of the individual optimal positions of all the particles, $P_i$ is the individual optimal position of the particle i, and $P_g$ is the global optimal position of the swarm, wherein $X_i(t+1)$ is the position, obtained in a $(t+1)^{th}$ iteration, of the particle i, t is a present iteration number and a is the companding factor.

* * * * *